United States Patent
Mieno

(10) Patent No.: US 7,615,475 B2
(45) Date of Patent: Nov. 10, 2009

(54) METHOD FOR FABRICATING LANDING POLYSILICON CONTACT STRUCTURES FOR SEMICONDUCTOR DEVICES

(75) Inventor: Fumitake Mieno, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 434 days.

(21) Appl. No.: 11/609,758

(22) Filed: Dec. 12, 2006

(65) Prior Publication Data
US 2008/0132008 A1    Jun. 5, 2008

(30) Foreign Application Priority Data
Dec. 1, 2006    (CN) .................. 2006 1 0119126

(51) Int. Cl.
*H01L 21/3205*    (2006.01)
(52) U.S. Cl. ................ 438/586; 438/691; 257/E21.585
(58) Field of Classification Search ................ 438/142, 438/586, 595, 597, 669, 685, 691; 257/E21.303, 257/E21.304, E21.585, E21.586, E21.59
See application file for complete search history.

(56) References Cited

U.S. PATENT DOCUMENTS

| 7,138,340 B2 * | 11/2006 | Lee et al. .................... 438/737 |
| 2005/0009280 A1 * | 1/2005 | Fishburn et al. ............. 438/275 |

OTHER PUBLICATIONS

Senzaki et al., Atomic Layer Deposition of High-k Thin Films for Gate and Capacitor Dielectrics, IEEE, pp. 269-274, 2004.*

* cited by examiner

*Primary Examiner*—Brook Kebede

(57) ABSTRACT

A method for forming an integrated circuit device, e.g., memory, logic. The method includes providing a semiconductor substrate (e.g., silicon wafer) comprising a surface region and forming a polysilicon layer overlying the surface region. Preferably, the polysilicon layer is doped with an impurity to provide conductive characteristics. The method forms a cap layer (e.g., silicon nitride, silicon oxynitride) overlying the polysilicon layer. The method forms an $Al_2O_3$ layer using atomic layer deposition overlying the polysilicon layer to form a sandwich structure including the polysilicon layer, cap layer, and $Al_2O_3$ layer. The method includes patterning the sandwich layer to form a plurality of gate structures. Each of the gate structures includes a portion of the polysilicon layer, a portion of the cap layer, and a portion of the $Al_2O_3$ layer. The method forms an interlayer dielectric material (e.g., BPSG, FSG) having an upper surface overlying the plurality of gate structures. The method also includes patterning the interlayer dielectric material to form an opening in a portion of the interlayer dielectric material to expose each of the gate structures and filling the opening with a polysilicon fill material to a vicinity of the upper surface of the interlayer dielectric material. Preferably, the fill material is doped using an impurity. The method also performs a chemical mechanical polishing process to remove a portion of the interlayer dielectric layer concurrently with a portion of the polysilicon fill material and maintains the chemical mechanical polishing process until a portion of the $Al_2O_3$ layer overlying one of the gate structures has been exposed. The method uses portions of the $Al_2O_3$ layer as a polish stop while preventing any exposure of any portion of the polysilicon layer.

20 Claims, 2 Drawing Sheets

METHOD FOR FABRICATING LANDING POLYSILICON CONTACT STRUCTURES FOR SEMICONDUCTOR DEVICES

CROSS-REFERENCES TO RELATED APPLICATIONS

This application claims priority to Chinese Application No. 200610119126.6; filed on Dec. 1, 2006; commonly assigned, and hereby incorporated by reference for all purposes.

BACKGROUND OF THE INVENTION

The present invention is directed to integrated circuits and their processing for the manufacture of semiconductor devices. More particularly, the invention provides a method and device for fabricating contact structures such as landing pad structures for semiconductor devices. Merely by way of example, the invention has been applied to the manufacture of advanced integrated circuit devices, but it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of an interconnect structure for memory devices. Such interconnect structures include, among others, plugs, metallization, and other designs. Although there have been significant improvements, such designs still have many limitations. As merely an example, these designs must become smaller and smaller but still require precise alignment to certain contact points. Additionally, these interconnect designs are often difficult to manufacture and generally require complex manufacturing processes and structures, which lead to inefficiencies and may cause low yields from "opens" or "shorts." These and other limitations will be described in further detail throughout the present specification and more particularly below.

From the above, it is seen that an improved technique for processing semiconductor devices is desired.

SUMMARY OF THE INVENTION

According to the present invention, techniques directed to integrated circuits and their processing for the manufacture of semiconductor devices are provided. More particularly, the invention provides a method and device for fabricating contact structures such as landing pad structures for semiconductor devices. Merely by way of example, the invention has been applied to the manufacture of advanced integrated circuit devices, but it would be recognized that the invention has a much broader range of applicability.

In a specific embodiment, the present invention provides a method for forming an integrated circuit device, e.g., memory, logic. The method includes providing a semiconductor substrate (e.g., silicon wafer) comprising a surface region and forming a polysilicon layer overlying the surface region. Preferably, the polysilicon layer is doped with an impurity to provide conductive characteristics. The method forms a cap layer (e.g., silicon nitride, silicon oxynitride) overlying the polysilicon layer. The method forms an $Al_2O_3$ layer using atomic layer deposition overlying the polysilicon layer to form a sandwich structure including the polysilicon layer, cap layer, and $Al_2O_3$ layer. The method includes patterning the sandwich layer to form a plurality of gate structures. Each of the gate structures includes a portion of the polysilicon layer, a portion of the cap layer, and a portion of the $Al_2O_3$ layer. The method forms an interlayer dielectric material (e.g., borophosphosilicate glass (BPSG), phosphosilicate glass (PSG), fluorinated silicon glass (FSG)) having an upper surface overlying the plurality of gate structures. The method also includes patterning the interlayer dielectric material to form an opening in a portion of the interlayer dielectric material to expose each of the gate structures and filling the opening with a polysilicon fill material to a vicinity of the upper surface of the interlayer dielectric material. Preferably, the fill material is doped using an impurity. The method also performs a chemical mechanical polishing process to remove a portion of the interlayer dielectric layer concurrently with a portion of the polysilicon fill material and maintains the chemical mechanical polishing process until a portion of the $Al_2O_3$ layer overlying one of the gate structures has been exposed. The method uses portions of the $Al_2O_3$ layer as a polish stop while preventing any exposure of any portion of the polysilicon layer.

In an alternative specific embodiment, the present invention provides an alternative method for forming an integrated circuit device. The method includes providing a semiconductor substrate comprising a surface region and forming a polysilicon layer overlying the surface region. The method forms a nitride cap layer overlying the polysilicon layer. In a preferred embodiment, the method also uses atomic layer deposition to form an Al2O3 layer overlying the polysilicon layer to form a sandwich structure including the polysilicon layer, the nitride cap layer, and the $Al_2O_3$ layer. A step of patterning the sandwich layer to form a plurality of interconnect structures is included. Each of the interconnect structures includes a portion of the polysilicon layer, a portion of the nitride cap layer, and a portion of the $Al_2O_3$ layer. The method forms an interlayer dielectric material having an upper surface overlying the plurality of interconnect structures and patterns the interlayer dielectric material to form an opening in a portion of the interlayer dielectric material to expose each of the interconnect structures. The interconnect structures comprises a first interconnect structure, a second interconnect structure, and a third interconnect structure. Next, the method includes filling the opening with a polysilicon fill material to a vicinity of the upper surface of the interlayer dielectric material and performing a chemical mechanical polishing process to remove a portion of the interlayer dielectric layer concurrently with a portion of the polysilicon fill material to planarize the interlayer dielectric layer and polysilicon fill material together. The method maintains the chemical mechanical polishing process until a portion of the $Al_2O_3$ layer overlying one of the interconnect structures has been exposed. The method also uses portions of the $Al_2O_3$ layer as a polish stop while preventing any exposure of any portion of the polysilicon layer.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the present invention provides a polish stop, which is easy to make and prevents damage to interconnect structures. Depending upon the application, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques directed to integrated circuits and their processing for the manufacture of semiconductor devices are provided. More particularly, the invention provides a method and structures for fabricating contact structures such as landing pad structures for semiconductor devices. Merely by way of example, the invention has been applied to the manufacture of advanced integrated circuit devices, but it would be recognized that the invention has a much broader range of applicability.

Figure 1:
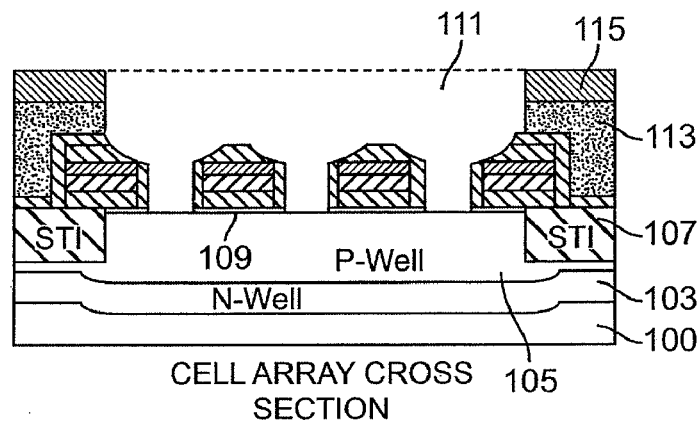
FIGS. 1 through 3 are simplified diagrams illustrating a conventional method for forming an interconnect structure according to an embodiment of the present invention.
Figure 2:
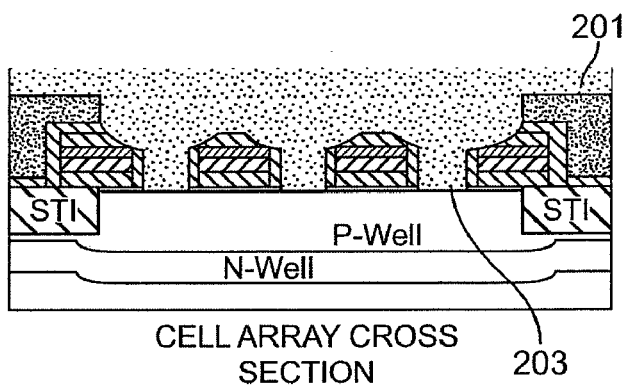
Figure 3:
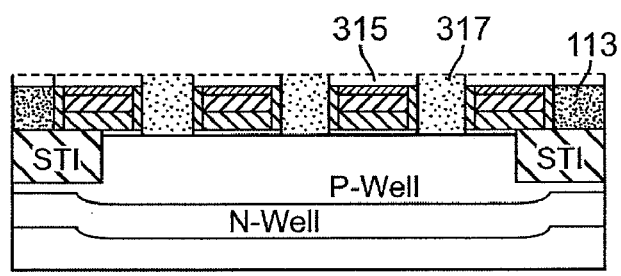

FIGS. 1 through 3 are simplified diagrams illustrating a conventional method for forming an interconnect structure according to an embodiment of the present invention. As shown, the conventional method includes providing a substrate 100, e.g., silicon wafer, silicon on insulator wafer. The substrate includes N-type well region 103 and P-type well region 105. A plurality of MOS transistor structures 109 are formed on the substrate. Each of the transistor structures includes a polysilicon gate layer and cap oxide layer. An opening 111 is formed within an interlayer dielectric layer, which is overlying the transistor structures and substrate. Field isolation oxide regions 107 are also included. The field isolation oxide regions are shallow trench isolation regions. A photomasking layer 115 is formed overlying the interlayer dielectric layer to pattern the interlayer dielectric layer.

Referring to FIG. 2, the conventional method deposits a polysilicon film material 201 within the opening to contact 203 to the substrate and portions of the transistor structures. The polysilicon film material will be used for contacts or plug structures. The polysilicon film material is preferably doped using an impurity such as phorphorous and the like. Gaps within the opening are filled with the polysilicon fill material.

The conventional method planarizes using chemical mechanical polishing the polysilicon fill material 317 and the interlayer dielectric material 113 as shown in FIG. 3. Since cap oxide layer 315 is similar in material to the interlayer dielectric material, conventional chemical mechanical polishing has poor selectivity, which causes over etching or over polishing and exposure to a portion of the underlying polysilicon gate layer. By exposing such layer, the resulting device has performance and/or reliability problems. These and other limitations of the conventional process can be found throughout the present specification and more particularly below.

A method according to the present invention for forming an interconnect structure can be outlined as follows.

1. Provide a semiconductor substrate comprising a surface region;
2. Form a polysilicon layer overlying the surface region;
3. Form a nitride cap layer overlying the polysilicon layer;
4. Use atomic layer deposition to form an $Al_2O_3$ layer overlying the polysilicon layer to form a sandwich structure including the polysilicon layer, the nitride cap layer, and the $Al_2O_3$ layer;
5. Pattern the sandwich layer to form a plurality of interconnect structures;
6. Form an interlayer dielectric material having an upper surface overlying the plurality of interconnect structures;
7. Pattern the interlayer dielectric material to form an opening in a portion of the interlayer dielectric material to expose each of the interconnect structures, including a first interconnect structure, a second interconnect structure, and a third interconnect structure;
8. Fill the opening with a polysilicon fill material to a vicinity of the upper surface of the interlayer dielectric material and performing a chemical mechanical polishing process to remove a portion of the interlayer dielectric layer concurrently with a portion of the polysilicon fill material to planarize the interlayer dielectric layer and polysilicon fill material together;
9. Maintain the chemical mechanical polishing process until a portion of the $Al_2O_3$ layer overlying one of the interconnect structures has been exposed;
10. Use portions of the $Al_2O_3$ layer as a polish stop while preventing any exposure of any portion of the polysilicon layer; and
11. Perform other steps, as desired.

The above sequence of steps provides a method according to an embodiment of the present invention. As shown, the method uses a combination of steps including a way of forming a film using chemical mechanical polishing and a stop layer made of atomic layer deposition. Other alternatives can also be provided where steps are added, one or more steps are removed, or one or more steps are provided in a different sequence without departing from the scope of the claims herein. Details of using the above method for atomic layer deposition is provided below.

Figure 4:
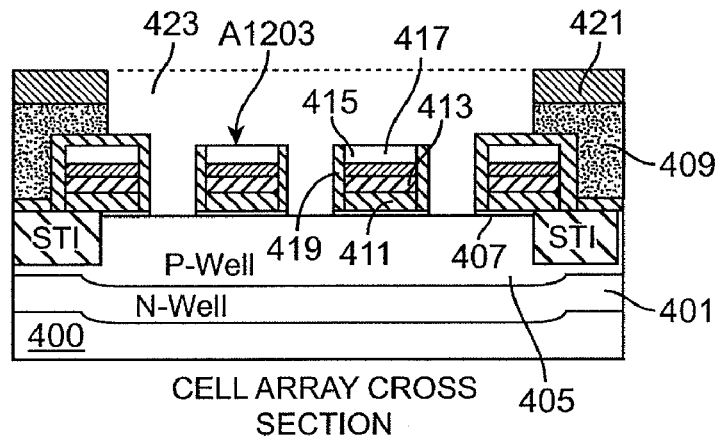
FIGS. 4 through 6 are simplified diagrams illustrating a method for forming an interconnect structure according to an embodiment of the present invention.
Figure 5:
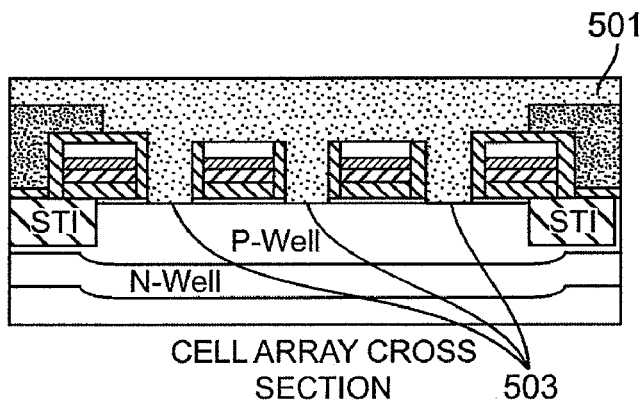
Figure 6:
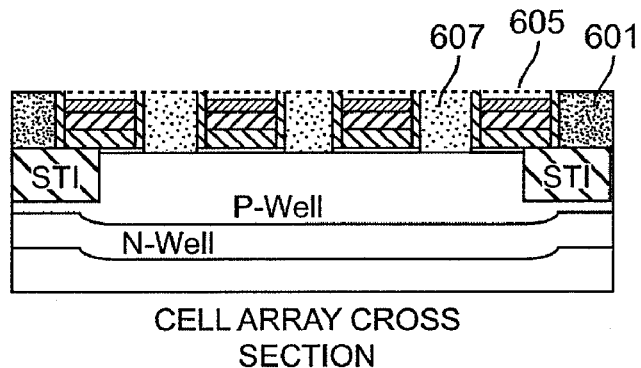

FIGS. 4 through 6 are simplified diagrams illustrating a method for forming an interconnect structure according to an embodiment of the present invention. These diagrams are merely examples, which should not limit the scope of the claims herein. One of ordinary skill in the art would recognize many variations, alternatives, and modifications. As shown, the present invention provides a method for forming an integrated circuit device, e.g., memory, logic. The method includes providing a semiconductor substrate 400 (e.g., silicon wafer) comprising a surface region. The substrate includes N-type well region 401 and P-type well region 405. The method includes forming a polysilicon layer overlying the surface region. Preferably, the polysilicon layer is doped with an impurity to provide conductive characteristics. The dopant can be phosphorous that is in-situ doped or diffused. The method forms a cap layer (e.g., silicon nitride, silicon oxynitride) overlying the polysilicon layer.

The method forms an $Al_2O_3$ layer using atomic layer deposition overlying the polysilicon layer to form a sandwich structure including the polysilicon layer, the cap layer, and the $Al_2O_3$ layer. The $Al_2O_3$ layer has a thickness ranging from about 1 nanometers to about 5 nanometers or has a thickness of about 3 nanometers and less. Preferably, the $Al_2O_3$ layer is formed using TMA (see below) and ozone bearing species. More preferably, atomic layer deposition is carried out at a temperature of less than 400 Degrees Celsius.

As background, Atomic Layer Deposition (ALD) is often characterized as a surface controlled "layer-by-layer" process for the deposition of thin films with atomic layer accuracy. As merely an example, trimethylaluminum (TMA) with water represents a common example of the ALD-process to form $Al_2O_3$. A example of atomic layer deposition is found at http://www.sigmaaldrich.com/Area_of_Interest/Chemistry/Materials_Science/Thin_Films_Microelectronics/Tutorial/Atomic_Layer_Deposition.html. Of course, one of ordinary skill in the art would recognize many other variations, modifications, and alternatives.

The method includes patterning the sandwich layer to form a plurality of gate structures. Each of the gate structures includes a portion 411 of the polysilicon layer, a portion 415 of the cap layer, and a portion of the $Al_2O_3$ layer 417. In a specific embodiment, the sandwich structure also includes a silicide layer 413, which can be tungsten silicide or other refractory metals. Each of the sandwich structures includes sidewall spacers 419, which can be made of oxide or nitride or a combination of oxide/nitride depending upon the embodiment.

The method forms an interlayer dielectric material 409 (e.g., BPSG, FSG) having an upper surface overlying the plurality of gate structures. The method also includes patterning the interlayer dielectric material to form an opening 423 in a portion of the interlayer dielectric material to expose each of the gate structures. The patterning often includes use of a patterned photoresist material 421 or hard mask. As shown, the opening exposes at least portions of four transistor devices. The opening also exposes at least three contact regions on the substrate according to a specific embodiment. Of course, one of ordinary skill in the art would recognize many other variations, modifications, and alternatives.

Referring to FIG. 5, the method fills the opening with a polysilicon fill material 501 to a vicinity of the upper surface of the interlayer dielectric material. Preferably, the fill material is doped using an impurity. The impurity can include phosphorus, which has been diffused or in-situ doped depending upon the application. The polysilicon fill material is connected to the three contract regions 503 on the substrate. Preferably, there are no gaps or openings within the polysilicon fill material. The fill material is formed over the upper surface of the interlayer dielectric material.

Referring to FIG. 6, the method also performs a chemical mechanical polishing process to remove a portion of the interlayer dielectric layer 601 concurrently with a portion of the polysilicon fill material 607 and maintains the chemical mechanical polishing process until a portion of the $Al_2O_3$ layer overlying one of the gate structures has been exposed. The method uses portions of the $Al_2O_3$ layer as a polish stop while preventing any exposure of any portion of the polysilicon layer. Preferably, the $Al_2O_3$ layer has a selectivity to polysilicon of 1:10. Optionally, the method performs an etchback or can substitute the chemical mechanical polishing process with etchback and chemical mechanical polishing. The etchback would use a fluorine bearing species such as HF or the like. Of course, one of ordinary skill in the art would recognize many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming an integrated circuit device, the method comprising:
   providing a semiconductor substrate comprising a surface region;
   forming a polysilicon layer overlying the surface region;
   forming a cap layer overlying the polysilicon layer;
   forming an $Al_2O_3$ layer using atomic layer deposition overlying the polysilicon layer to form a sandwich structure including the polysilicon layer, cap layer, and $Al_2O_3$ layer;
   patterning the sandwich layer to form a plurality of gate structures, each of the gate structures including a portion of the polysilicon layer, a portion of the cap layer, and a portion of the $Al_2O_3$ layer;
   forming an interlayer dielectric material having an upper surface overlying the plurality of gate structures;
   patterning the interlayer dielectric material to form an opening in a portion of the interlayer dielectric material to expose each of the gate structures;
   filling the opening with a polysilicon fill material to a vicinity of the upper surface of the interlayer dielectric material;
   performing a chemical mechanical polishing process to remove a portion of the interlayer dielectric layer concurrently with a portion of the polysilicon fill material;
   maintaining the chemical mechanical polishing process until a portion of the $Al_2O_3$ layer overlying one of the gate structures has been exposed; and
   using portions of the $Al_2O_3$ layer as a polish stop while preventing any exposure of any portion of the polysilicon layer.

2. The method of claim 1 wherein the cap layer comprises silicon nitride.

3. The method of claim 1 wherein the $Al_2O_3$ layer has a thickness ranging from about 1 nanometers to about 5 nanometers.

4. The method of claim 1 wherein the $Al_2O_3$ layer has a thickness of about 3 nanometers.

5. The method of claim 1 wherein the $Al_2O_3$ layer is formed using TMA and ozone bearing species.

6. The method of claim 1 wherein the $Al_2O_3$ and polysilicon have a selectively ratio of 1:10.

7. The method of claim 1 wherein the chemical mechanical polishing process comprises fluorine bearing species.

8. The method of claim 1 wherein the $Al_2O_3$ layer is substantially free from pin holes or other imperfections.

9. The method of claim 1 wherein the plurality of gate structures consists of three gate structures.

10. The method of claim 1 further comprising performing an etch back process after the chemical mechanical polishing process.

11. A method for forming an integrated circuit device, the method comprising:

providing a semiconductor substrate comprising a surface region;

forming a polysilicon layer overlying the surface region;

forming a nitride cap layer overlying the polysilicon layer;

using atomic layer deposition to form an $Al_2O_3$ layer overlying the polysilicon layer to form a sandwich structure including the polysilicon layer, the nitride cap layer, and the $Al_2O_3$ layer;

patterning the sandwich layer to form a plurality of interconnect structures, each of the interconnect structures including a portion of the polysilicon layer, a portion of the nitride cap layer, and a portion of the $Al_2O_3$ layer;

forming an interlayer dielectric material having an upper surface overlying the plurality of interconnect structures;

patterning the interlayer dielectric material to form an opening in a portion of the interlayer dielectric material to expose each of the interconnect structures, the interconnect structures comprising a first interconnect structure, a second interconnect structure, and a third interconnect structure;

filling the opening with a polysilicon fill material to a vicinity of the upper surface of the interlayer dielectric material;

performing a chemical mechanical polishing process to remove a portion of the interlayer dielectric layer concurrently with a portion of the polysilicon fill material to planarize the interlayer dielectric layer and polysilicon fill material together;

maintaining the chemical mechanical polishing process until a portion of the $Al_2O_3$ layer overlying one of the interconnect structures has been exposed; and using portions of the $Al_2O_3$ layer as a polish stop while preventing any exposure of any portion of the polysilicon layer.

12. The method of claim 11 wherein at least one of the interconnect structures is a bit line for a memory device or a word line for a memory device.

13. The method of claim 11 wherein the $Al_2O_3$ layer has a thickness ranging from about 1 nanometers to about 5 nanometers.

14. The method of claim 11 wherein the $Al_2O_3$ layer has a thickness of about 3 nanometers.

15. The method of claim 11 wherein the $Al_2O_3$ layer is formed using TMA and ozone bearing species.

16. The method of claim 11 wherein the $Al_2O_3$ and polysilicon have a selectively ratio of 1:10.

17. The method of claim 11 wherein the chemical mechanical polishing process comprises fluorine bearing species.

18. The method of claim 11 wherein the $Al_2O_3$ layer is substantially free from pin holes or other imperfections.

19. The method of claim 11 wherein the plurality of gate structures consists of three gate structures.

20. The method of claim 11 further comprising performing an etch back process after the chemical mechanical polishing process.

* * * * *